(12) United States Patent
Ikeda et al.

(10) Patent No.: US 8,492,793 B2
(45) Date of Patent: Jul. 23, 2013

(54) SEMICONDUCTOR DEVICE AND METHOD OF MANUFACTURING THE SAME

(75) Inventors: Keiji Ikeda, Yokohama (JP); Tsutomu Tezuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 162 days.

(21) Appl. No.: 12/888,805

(22) Filed: Sep. 23, 2010

(65) Prior Publication Data
US 2011/0210375 A1    Sep. 1, 2011

(30) Foreign Application Priority Data
Feb. 26, 2010    (JP) ................................ 2010-042942

(51) Int. Cl.
*H01L 29/66* (2006.01)
(52) U.S. Cl.
USPC .................................. 257/192; 257/E29.268
(58) Field of Classification Search
USPC .......... 257/192, E29.248, 190, 191, E29.042, 257/E27.06, E29.179, E29.268
See application file for complete search history.

(56) References Cited

U.S. PATENT DOCUMENTS

| | | | |
|---|---|---|---|
| 7,812,370 B2* | 10/2010 | Bhuwalka et al. | 257/192 |
| 2003/0094637 A1* | 5/2003 | Awano | 257/288 |
| 2004/0070051 A1* | 4/2004 | Sugiyama et al. | 257/616 |
| 2005/0269595 A1* | 12/2005 | Tezuka | 257/183 |
| 2007/0045610 A1* | 3/2007 | Lee et al. | 257/19 |
| 2007/0057347 A1* | 3/2007 | Ikeda | 257/616 |
| 2008/0057635 A1* | 3/2008 | Chen | 438/197 |
| 2008/0067495 A1* | 3/2008 | Verhulst | 257/12 |
| 2008/0169485 A1* | 7/2008 | Heyns et al. | 257/194 |
| 2010/0123203 A1* | 5/2010 | Bhuwalka et al. | 257/402 |
| 2010/0163847 A1* | 7/2010 | Majhi et al. | 257/24 |
| 2010/0200916 A1* | 8/2010 | Gossner et al. | 257/335 |
| 2011/0049582 A1* | 3/2011 | Johnson et al. | 257/288 |
| 2011/0212587 A1* | 9/2011 | Johnson et al. | 438/286 |
| 2011/0303950 A1* | 12/2011 | Lauer et al. | 257/192 |
| 2012/0043607 A1* | 2/2012 | Luisier et al. | 257/335 |

FOREIGN PATENT DOCUMENTS

| | | |
|---|---|---|
| CN | 101635262 A | 1/2010 |
| JP | 2-211638 A | 8/1990 |

OTHER PUBLICATIONS

Toh, et al., "Device physics and design of germanium tunneling field-effect transistor with source and drain engineering for low power and high performance applications", Journal of Applied Physics, vol. 103, pp. 104504-1 to 104504-5, (2008).
Krishnamohan, et al., "Double-Gate Strained-Ge Heterostructure Tunneling FET (TFET) With Record High Drive Currents and <60 mV/dec Subthreshold Slope", Tech. Dig. Int. Electronic Devices Meeting, pp. 947-949, (2008).
Bhuwalka, et al., "P-Channel Tunnel Field-Effect Transistors down to Sub-50 nm Channel Lengths", Japanese Journal of Applied Physics, vol. 45, No. 4B, pp. 3106-3109, (2006).
Chinese Patent Office Action Mail No. 2013010701032440, mailed Jan. 10, 2013 regarding Chinese Patent Application No. 20100283375.5.

* cited by examiner

*Primary Examiner* — Matthew Landau
*Assistant Examiner* — Latanya N Crawford
(74) *Attorney, Agent, or Firm* — Finnegan, Henderson, Farabow, Garrett & Dunner, LLP

(57) ABSTRACT

According to one embodiment, a semiconductor device including a tunnel FET, includes a gate electrode, which is formed on a first semiconductor layer formed of $Si_{1-X}Ge_X$ ($0<x\leq1$) through a gate insulating film, a source electrode, which is formed of a compound of a second semiconductor formed mainly using Ge and a metal, a drain electrode, which is formed of a compound of the first semiconductor layer and the metal, and a silicon (Si) thin film, which is formed between the source electrode and the first semiconductor layer. An edge portion of the source electrode and an edge portion of the drain electrode have a positional relationship of Asymmetrical to the gate electrode. The edge portion of the drain electrode is far away from an edge portion of the gate electrode toward a gate external direction compared with the edge portion of the source electrode.

10 Claims, 10 Drawing Sheets

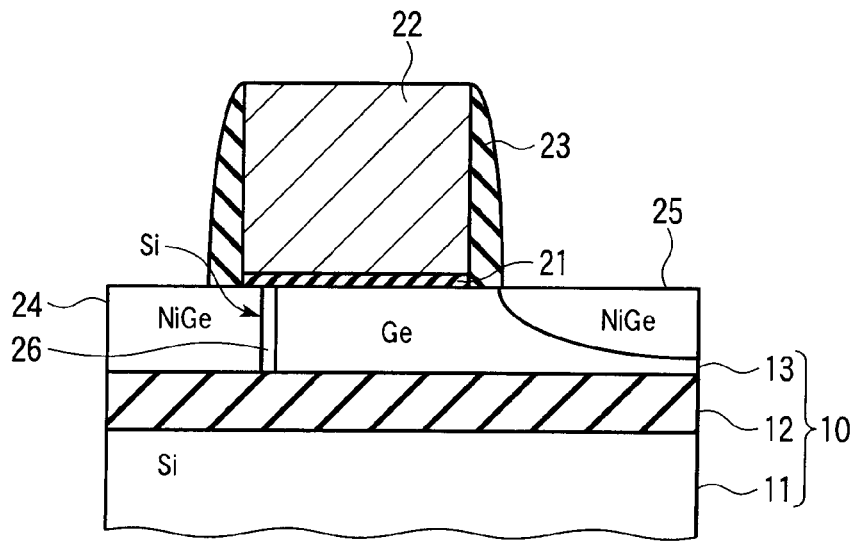
F I G. 1
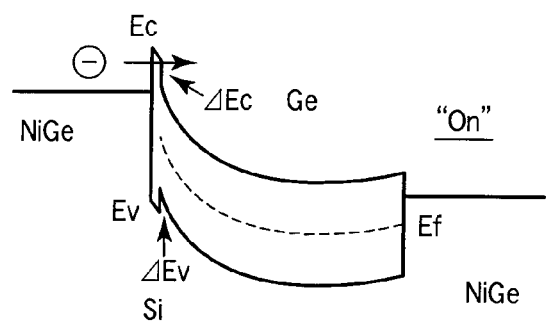
F I G. 2A
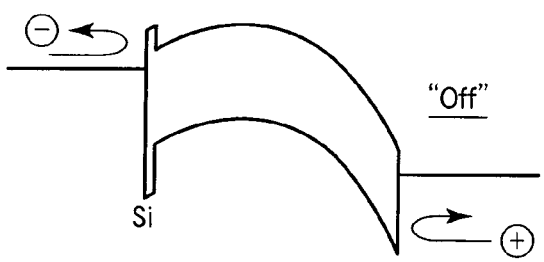
F I G. 2B

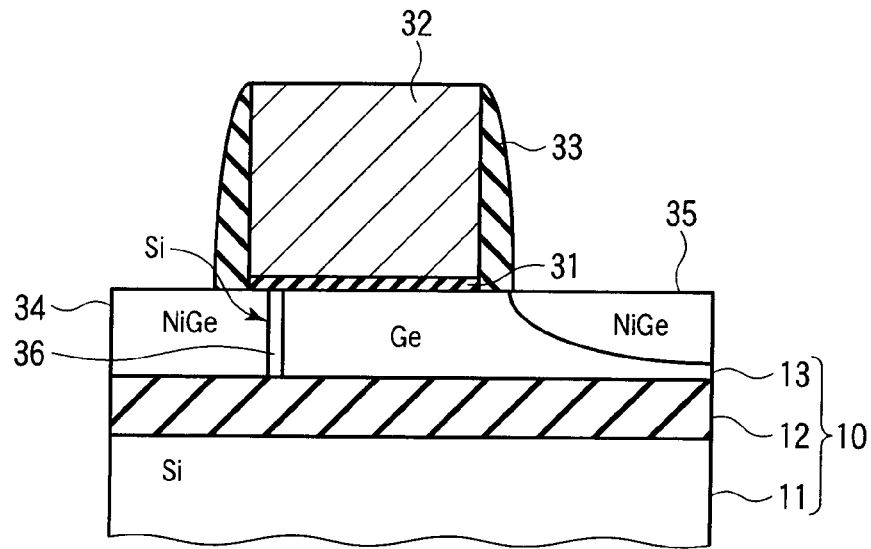
F I G. 3
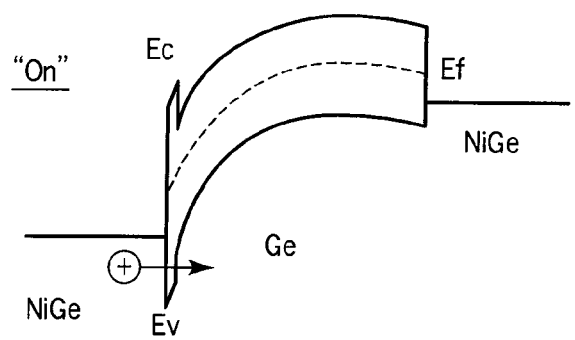
F I G. 4A
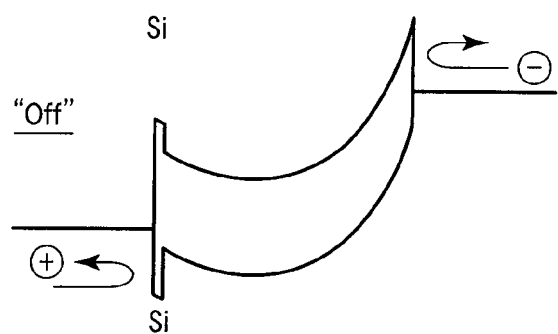
F I G. 4B

US 8,492,793 B2

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2010-042942, filed Feb. 26, 2010; the entire contents of which are incorporated herein by reference.

FIELD

Embodiments described herein relate generally to a semiconductor device including a tunnel FET, and to a method of manufacturing the same.

BACKGROUND

Conventionally, in a tunnel FET (TFET) having a germanium (Ge) channel, source, channel and drain are formed by means of a pin junction formed by ion implantation. A current drive ability is determined depending on band-to-band tunneling (BTBT) by a source junction. For this reason, in order to improve a drive current, a high-density and steep junction is formed; in this way, a tunnel barrier must be thinned to a thickness of 1 to 3 nm. However, the foregoing junction is formed by using ion implantation and activation annealing; for this reason, there is a limit to the control of junction steepness resulting from ion implantation conditions and impurity diffusion.

The following method has been proposed as a method of realizing a steeper impurity profile instead of using ion implantation. According to the foregoing method, silicon (Si) doped with B and As is epitaxially grown to form a source/drain. However, according to this method, impurity diffuses in a channel; as a result, a steep junction is not formed. Therefore, threshold voltage variations inevitably occur due to un-uniformity of impurity distribution after a junction is formed.

On the other hand, a device for achieving the purpose of low energy consumption is required to reduce a leakage current. An off-leakage current is determined depending on BTBT by a drain-junction. For this reason, a low-density and gradual junction of channel/drain is formed, and thereby, there is a need to thicken a tunnel barrier. However, according to the foregoing method, the following issue inevitably arises; namely, a parasitic resistance increases due to low density of a drain.

Moreover, the following device for achieving the purpose described below has been proposed. Specifically, a source is formed by using Ge having a low band gap (0.69 eV), and a channel and a drain are formed by using Si having a high band gap (1.12 eV). In this way, a tunnel barrier of a source terminal is formed thin while a tunnel barrier of a drain terminal is formed thick. However, in the foregoing device, it is not found to solve a problem related to the control of an interface steepness of a junction formed by impurity diffusion and to threshold voltage variations resulting from non-uniform impurity distribution.

BRIEF DESCRIPTION OF THE DRAWINGS

FIG. 1 is a cross-sectional view showing the device structure of a semiconductor device (n-type FET) according to a first embodiment;

FIGS. 2A and 2B are energy band diagrams of the n-type FET shown in FIG. 1;

FIG. 3 is a cross-sectional view showing the device structure of a semiconductor device (p-type FET) according to a first embodiment;

FIGS. 4A and 4B are energy band diagrams of the p-type FET shown in FIG. 3;

DETAILED DESCRIPTION

Figure 5A:
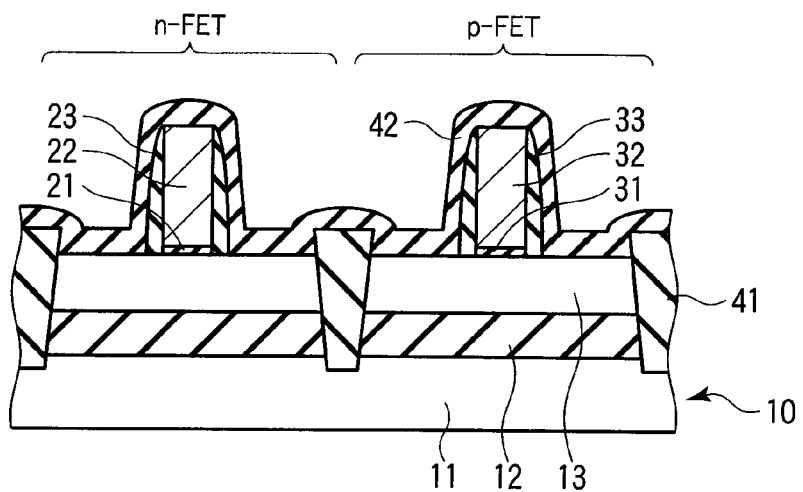
FIGS. 5A, 5B, 5C, 5D, 5E, 5F, 5G, 5H and 5I are cross-sectional views showing the process of manufacturing a semiconductor device according to a second embodiment.

In general, according to one embodiment, there is provided a semiconductor device including a tunnel FET, includes: a gate electrode, which is formed on a first semiconductor layer formed of $Si_{1-x}Ge_X$ ($0<x\leqq1$) through a gate insulating film; a source electrode, which is formed on one of two regions between which a channel region is interleaved, the channel region corresponding to the gate electrode of the semiconductor layer, and formed of a compound of a second semiconductor formed mainly using Ge and a metal; a drain electrode, which is formed on the other of two regions formed via the channel region, and formed of a compound of the first semiconductor layer and the metal; and a silicon (Si) thin film, which is formed between the source electrode and the first semiconductor layer. An edge portion on the gate side of the source electrode and an edge portion on the gate side of the drain electrode have a positional relationship of non-symmetrical to the gate electrode. The edge portion on the gate side of the drain electrode is far away from an edge portion of the gate electrode toward a gate external direction compared with the edge portion on the gate side of the source electrode.

Various embodiments will be hereinafter described with reference to the accompanying drawings.

(First Embodiment)

FIGS. 1, 2A, 2B, 3, 4A and 4B are views to explain a semiconductor device according to a first embodiment. This embodiment relates to a new tunnel FET, which is configured to insert a silicon (Si) thin film between a NiGe source and a strain Ge channel as a tunnel barrier layer. Further, this embodiment is applicable to both of an N-type FET and a p-type FET.

FIG. 1 shows the structure of an n-type FET. As shown in FIG. 1, a gate electrode is formed on a part of a Ge-on-insulator (GOI) substrate 10, which is configured to form a Ge layer 13 on a silicon (Si) substrate 11 through an embedded insulating film 12. In other words, a gate electrode 22 is formed above a channel region between source/drain regions of the GOI substrate through a gate insulating film 21. The sidewall insulating films 23 are formed on the side portion of the gate electrode 22. In this case, a Ge channel made of the Ge layer 13 of the GOI substrate 10 has a strain.

A source/drain region is made of a metal compound using Ni and Pt or those alloys. For example, the source/drain region is a metal electrode made of NiGe. A silicon (Si) thin film 26 is interposed as a tunnel barrier layer between the source electrode 24 and a Ge channel region. The interface between the source electrode 24 and the Si thin film 26 and the interface between the Si thin film 26 and the channel region are both vertical to the substrate surface. On the other hand, the interface between the drain electrode 25 and the channel region is gradual as well as a typical pn junction.

An edge portion on the source side of the gate electrode 22 approximately coincides with the interface between the Si thin film 26 and the source electrode 24, or is overlapped on the source electrode 24. An edge portion of the drain electrode 25 is back away to the drain electrode side from an edge portion on the drain side of the gate electrode 22. In other words, an edge portion on the gate side of the source electrode 24 and an edge portion on the gate side of the drain electrode 25 have a positional relationship Asymmetrical with respect to the gate electrode 22. The edge portion on the gate side of the drain electrode 25 is far way toward the gate external direction from the edge portion of the gate electrode compared with the edge portion on the gate side of the source electrode 24. This is because a contribution of an electric field by a gate electrode is increased in the source side while the contribution is decreased in the drain side.

FIG. 3 shows the structure of a p-type FET. As seen from FIG. 3, the p-type FET has the same structure as the n-type FET. Specifically, a gate insulating film 31, a gate electrode 32 and a sidewall insulating films 33 are formed on the GOI substrate 10. A source/drain region is a germanide electrode made of NiGe, for example. A silicon (Si) thin film 36 is inserted as a tunnel barrier layer between a source electrode 34 and a Ge channel region. Each interface of the source electrode 34, the Si thin film 36 and the channel region is vertical to the substrate surface. The interface between the drain electrode 35 and the channel region is gradual. An edge portion on the source side of the gate electrode 32 approximately coincides with the interface between the Si thin film 36 and the source electrode 34, or is overlapped on the source electrode 34. An edge portion of the drain electrode 35 is back away to the drain electrode side from an edge portion on the drain side of the gate electrode 32.

As seen from FIGS. 2A and 2B, in the n-type FET, conduction band edge energy Ec of the Si thin film 26 becomes higher than that of the Ge layer 13. Moreover, a Fermi energy of the source and drain electrodes 24 and 25 is located near to a conduction band compared with a mid-gap Ef of the Ge layer 13. On the other hand, as seen from FIGS. 4A and 4B, in the p-type FET, a valence band edge energy Ev of the Si thin film 36 becomes lower than that of the Ge layer 13. Moreover, a Fermi energy of the source and drain electrodes 34 and 35 is located near to a valence band compared with a mid-gap Ef of the Ge layer 13.

In the n-type FET, a carrier flows tunneling through a thin barrier of the Si thin film 26 in the on state as shown in FIG. 2A. Conversely, a carrier does not flow in the off state as shown in FIG. 2B. This is because the conduction band edge energy in the vicinity of the source of the Ge layer 13 becomes lower than the Fermi energy of the source electrode 24 together with the barrier of the Si thin film 26. The strain of the Ge layer 13 contributes to the energy band difference between the Si thin film 26 and the Ge layer 13. Namely, the strain exits, and thereby, the band difference becomes large.

Therefore, particularly, in the n-type FET, it is desirable to give a strain to an n layer functioning as a channel.

In the p-type FET, a carrier flows tunneling through a thin barrier of the Si thin film 36 in the on state as shown in FIG. 4A. Conversely, a carrier does not flow in the off state as shown in FIG. 4B. This is because the valence band edge energy in the vicinity of the source of the Ge layer 13 is higher than the Fermi energy of the source electrode 34 together with the barrier of the Si thin film 36.

According to this embodiment, a source and drain which are conventionally formed by using the pn junction, have a Schottky junction. The Schottky junction is formed of germanide, which is a metal compound by using Ni, Pt, or those alloys. In this case, the Si thin films 26 and 36 having conduction band energy and valence band energy higher than that of the strain Ge functioning as a channel are inserted into the source side only in a range from 1 nm to 3 nm. In this way, the Si tunnel layer having a NiGe/Si/Ge hetero structure is formed. As described in the following embodiment, the NiGe/Si/Ge hetero structure is formed by using a selective germanidation process which makes the growth of germanide self-stop at the interface.

A silicon (Si) tunnel layer has the following features. Specifically, the film thickness is accurately controllable by using selectively epitaxial growth. Further, a conduction band and a valence band are formed with band offset; therefore, a steep tunnel barrier is obtained without a high-density impurity doping. Furthermore, non-uniformity of impurity distribution is avoidable; threshold voltage variations are reduced compared with a pn junction type formed by using ion implantation.

Moreover, it is known that a Fermi level of germanide is pinned in the vicinity of about 60 meV from a valence band with respect to Ge. In case of Si, it is also known that the Fermi level of germanide is pinned on the side of a valence band. In the n-type FET, a position where the Fermi level of germanide is pinned at the source edge is shifted to the conduction band side by segregated elements such as S and Se to the interface. By using this way, it is able to improve the carrier injection efficiency to a channel, and thereby the current drive ability is increased. Conversely, in the p-type FET, a pinning position is situated to the side of a valence band with respect to both of Si and Ge. Therefore, the film thickness of a tunnel layer is determined by considering the band offset of a valence band formed by a Si/strained Ge junction.

Moreover, according to a conventional structure, the following design is possible. Specifically in the drain region needed to make the impurity concentration low, it is also able to design reducing a parasitic resistance with keeping a leakage current lower to reduce an off-leakage. This is based on the following reason. Namely, a drain is formed into a metal S/D, and in addition a position where the Fermi level of germanide is pinned in a drain edge is suitably controllable by using a method of segregated elements such as S and Se to the interface. Further, the drain is made of germanide; therefore, this serves to reduce an influence of a parasitic resistance resulting from the influence by low density, which is a problem in a pn junction type.

More specifically, in the n-type FET, the pinning position is shifted to the side of a conduction band by using elements such as S and Se. In this way, tunneling of hole from the drain to the channel is restricted; as a result, a leakage current is reduced (FIG. 2). On the other hand, in the p-type FET, a barrier of about 0.6 eV exists in an electron tunnel from the drain to the channel. For this reason, the structure is provided such that a leakage current is reduced without controlling the pinning position (FIG. 4).

Moreover, anisotropic etching for preferentially leaving a Ge (110) plane is employed in the source edge, and thereby, it is possible to reduce line edge roughness (LER) on a junction interface, which is a factor of threshold voltage variations. In this way, uniform and steep source junction is realized; therefore, remarkable improvement of yield is expected.

According to this embodiment, in a GOI channel Schottky barrier TFET, Si thin films 26 and 36 are inserted as a tunnel barrier layer between NiGe source and Ge channel. These Si thin films 26 and 36 are formed sufficiently thin (e.g., 1 to 3 nm), and thereby, a steep tunnel barrier is obtained without doping of high-density impurities. In addition, impurity non-uniformity is avoidable; therefore, threshold voltage variations are reduced compared with a pn junction formed by using ion implantation and epitaxial growth.

(Second Embodiment)

A method of manufacturing a semiconductor device according to a second embodiment will be described below with reference to FIGS. 5A to 5I. This second embodiment relates to a complementary transistor comprising a strain GOI channel germanide S/D TFET.

As shown in FIG. 5A, an isolation layer 41 by shallow trench isolation (STI) is formed on a strain GOI substrate 10 using a well-known method. The thickness of a Ge layer 13 of the GOI substrate 10 is 15 to 30 nm. Then, a conduction layer is formed through an insulating film, and thereafter, these layers are processed using RIE. In this way, a gate insulating film 21 and a gate electrode 22 are formed on an nFET side while a gate insulating film 31 and a gate electrode 32 are formed on a pFET side. For example, insulating films such as $GeO_2$, GeON, $SiO_2$, SiON, $HfO_2$, $Al_2O_3$, $HfAl_xO_y$, HfLaO and $La_xO_y$ may be used as the gate insulating films 21 and 31. Moreover, polysilicon metal or the stacked structure may be used as the gate insulating films 21 and 31. An insulating film having a thickness of 5 nm is deposited on the entire surface, and thereafter, etch-back is carried out so that the insulating film is left on a gate sidewall. In this way, gate sidewall insulating films 23 and 33 are formed. For example, a silicon (Si) oxide film, a Si nitride film or the stacked structure of those may be used as the gate sidewall insulating films 23 and 33. In this state, the whole of the device is covered with an oxide film 42 having a thickness of 10 nm.

Figure 5B:
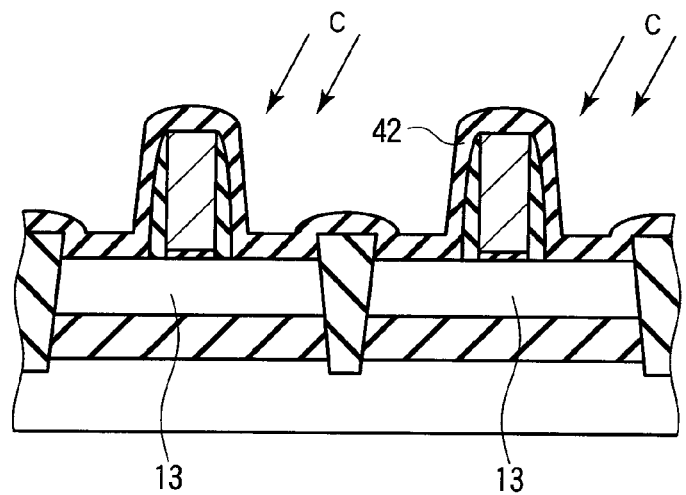
Figure 5C:
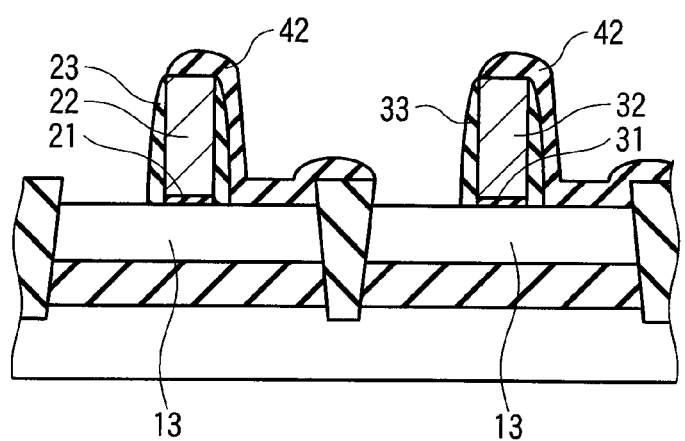

As illustrated in FIG. 5B, carbon is implanted with a dose of $10^{13}$ to $10^{15}$ $cm^{-2}$ order using oblique ion implantation. In this way, the oxide film 42 covering the drain side is modified. In the oxide film 42 modified by carbon, the etching rate is reduced.

Thereafter, the oxide film 42 is etched by means of wet etching using a dilute hydrogen fluoride (DHF) solution. In this way, as seen from FIG. 5C, a source portion only is selectively opened.

Figure 5D:
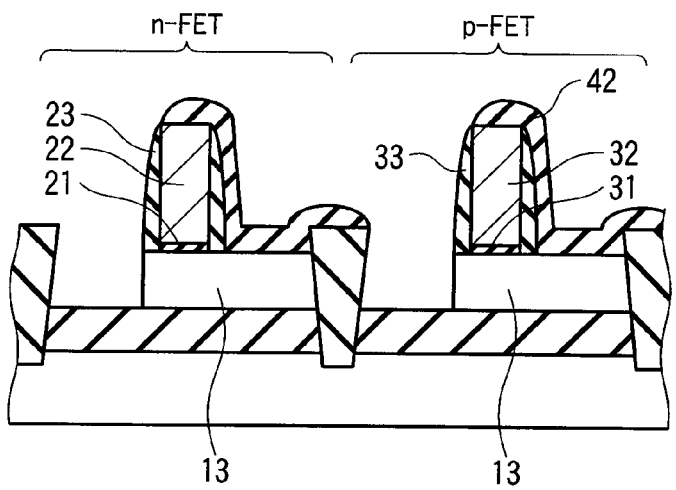

As depicted in FIG. 5D, the Ge channel layer 13 of the opened source portion is selectively etched using reactive ion etching (RIE).

Figure 5E:
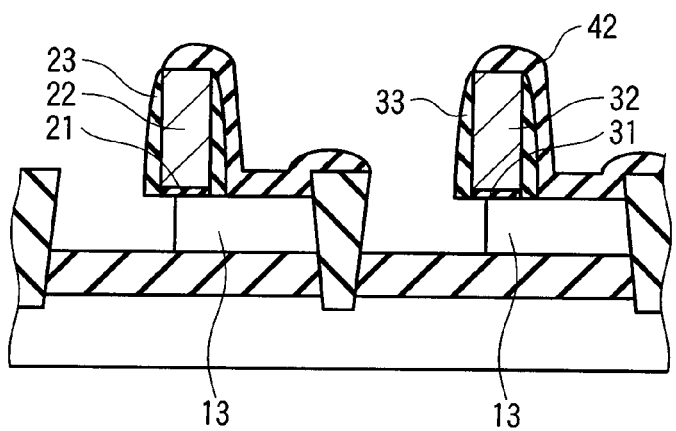

As seen from FIG. 5E, a (110) plane appears on the side of a trench by means of anisotropic etching using an ammonia hydrogen peroxide mixed solution or hydrochloric acid hydrogen peroxide mixed solution, for example. In this way, the line edge roughness of the gate edge is reduced. Further, etching is controlled so that a gate overlap length of the source is set to about 2 nm. The overlap length is used as a parameter for determining a current drive ability and an overlap capacitance given as a parasitic capacitance. The current drive ability and the overlap capacitance have a tradeoff relationship; therefore, optimization is carried out based on the relationship between a gate capacitance and a current drive ability.

The foregoing anisotropic etching will be explained below.

Figure 6:
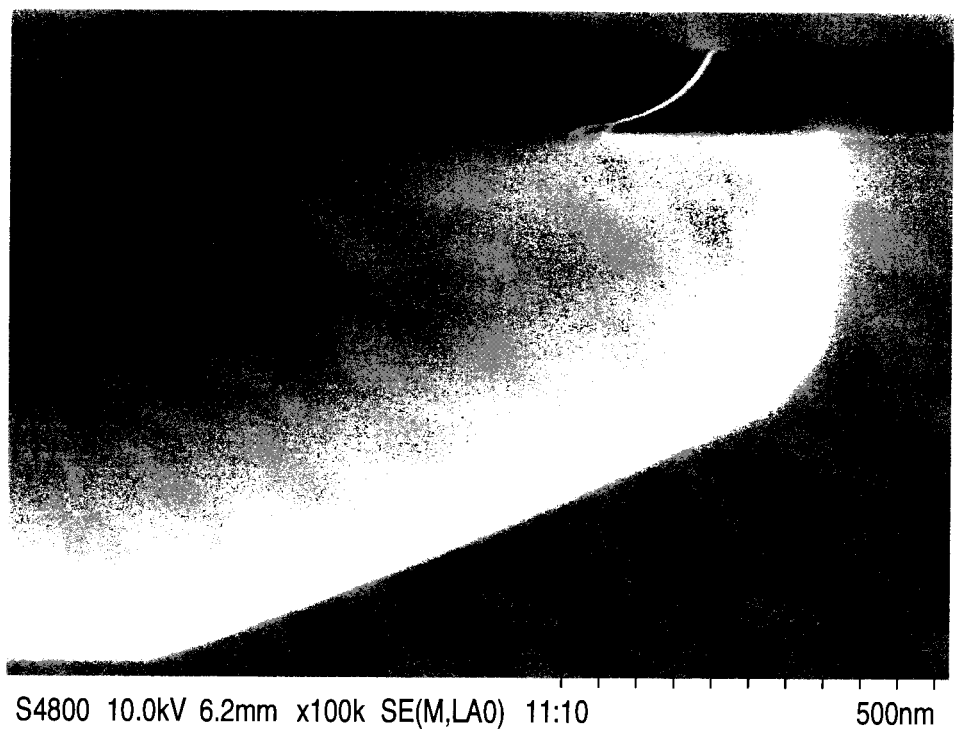
FIG. 6 is a microscope photograph showing a cross section when a Ge layer is selectively etched using APM.

According to this embodiment, a Ge channel portion is selectively etched by means of anisotropic wet etching by using a $NH_4OH$, $H_2O_2$ mixed solution (APM) or HCl, $H_2O_2$ mixed solution (HPM). Inventors processed a $SiO_2$ film deposited on a Ge substrate by means of RIE by using a resist as a mask. Thereafter, they processed a fin by means of RIE by using the $SiO_2$ film as a mask. Then, we carried out anisotropic etching using the foregoing etching solution ($NH_4OH$: $H_2O_2$=250:1) to the fin. As a result, as seen from the electron microscope photograph shown in FIG. 6, it was confirmed that the side of the fin was formed with a (110) plane, which was formed vertically from the lower surface of the mask, and the uniformity of the fin width was improved. Further, it was confirmed that the LER was improved, and the side of the fin (surface vertical to the substrate surface) showed anisotropy preferentially leaving a (110) plane. In FIG. 6, a Ge substrate is used; however, according to this embodiment, the Ge layer 13 formed on the insulting film 12 is formed thin, and thereby the whole of the side of the Ge layer 13 functions as a (110) plane.

Moreover, an etching profile changes depending on APM concentration. In other words, the etching profile changes depending on a mixed ratio of $NH_4OH$ and $H_2O_2$. When the concentration of $NH_4OH$ is relatively high, the etching section is becoming to isotropy, and therefore, a good-quality (110) plane appears in the etching side. However, when the concentration of $NH_4OH$ is too high (concentration of $H_2O_2$ is too low), the profile becomes fully isotropy. For this reason, no (110) plane is generated, and in addition, the etching rate becomes extremely slow. On the other hand, when the concentration of $H_2O_2$ is too high (concentration of $NH_4OH$ is too low), the anisotropy of the etching section becomes strong; as a result, a (111) plane appears, and a (110) plane is not generated.

Inventors conducted an experiment of etching using APM with various concentrations, and then, found concentrations in which a (110) plane appears in the etching side. The experimental result is shown in the following Table 1.

TABLE 1

| $NH_4OH:H_2O_2:H_2O$ (Volume ratio) | $NH_4OH:H_2O_2$ (mol/L) | $NH_4OH:H_2O_2$ (Molality ratio) |
|---|---|---|
| 250:1:0 | 9.470:0.069 | 138.04:1 |
| 500:1:0 | 9.490:0.034 | 276.08:1 |
| 1000:1:0 | 9.501:0.017 | 552.16:1 |
| 100:1:0 | 9.409:0.170 | 55.22:1 |
| 100:1:500 | 1.130:0.020 | 55.22:1 |
| 10:1:500 | 0.127:0.023 | 5.52:1 |

Moreover, when the mixed ratio was set to 1:1:500 (molality ratio 0.55:1), no (110) plane appears. From the experimental result, it can be seen that if $H_2O_2$ is set as 1, when the molality ratio of $NH_4OH$ is more than 6 and less than 552, a (110) plane appears. Therefore, in order to generate a (110) plane on the etching side of the Ge layer, it is preferable that the molality ratio of $NH_4OH$ is set to a range from 6 to 552. In this case, even if the molality ratio is set out of the foregoing range, there is the possibility that a (110) plane appears. However, from the foregoing inventor's experimental result, it is confirmed that a (110) plane appears as long as the molality ratio of $NH_4OH$ is set within at least the foregoing range. Moreover, the concentration of H2O has a relationship with an etching rate; however, it does not have a relationship with an etching profile.

According to etching using HPM, when the concentration of HCl is relatively low, an etching side is becoming to isotropy, and thus a good-quality (110) plane appears in the etching side. However, when the concentration of HCl is too low (concentration of $H_2O_2$ is too high), anisotropy becomes strong; as a result, a (111) plane appears, and a (110) plane is not generated. Conversely, when the concentration of HCl is too high (concentration of $H_2O_2$ is too low), the etching side becomes fully isotropy; as a result, no (110) plane is generated, and in addition the etching rate becomes extremely slow.

Inventors conducted an experiment of etching using HPM with various concentrations, and then found concentrations in which a (110) plane appears in the etching side. The experimental result is shown in the following Table 2.

TABLE 2

| $HCl:H_2O_2:H_2O$ (Volume ratio) | $HCl:H_2O_2$ (mol/L) | $HCl:H_2O_2$ (Molality ratio) |
|---|---|---|
| 1:2:1000 | 0.011:0.023 | 0.49:1 |
| 10:2:1000 | 0.112:0.023 | 4.87:1 |
| 50:2:1000 | 0.545:0.022 | 24.35:1 |

From the foregoing experimental result, it can be seen that if $H_2O_2$ is set as 1, when the molality ratio is more than 0.5 and less than 24, a (110) plane appears. Therefore, in order to generate a (110) plane on the etching side of the Ge layer, it is preferable that the molality ratio of HCl is set to a range from 0.5 to 24.

When the Ge layer is etched by using HPM, a reverse taper portion is left on the Ge layer. In this case, etching by using HPM is carried out, and thereafter etching by using APM is carried out, and thereby the reverse taper portion is removed. Therefore, if the reverse taper portion has no problem, a Ge fin structure formed by etching by using HPM is usable as a FinFET formation substrate as it is. Conversely, if the reverse taper portion has a problem, etching using HPM is carried out, and thereafter etching using APM is carried out.

Figure 5F:
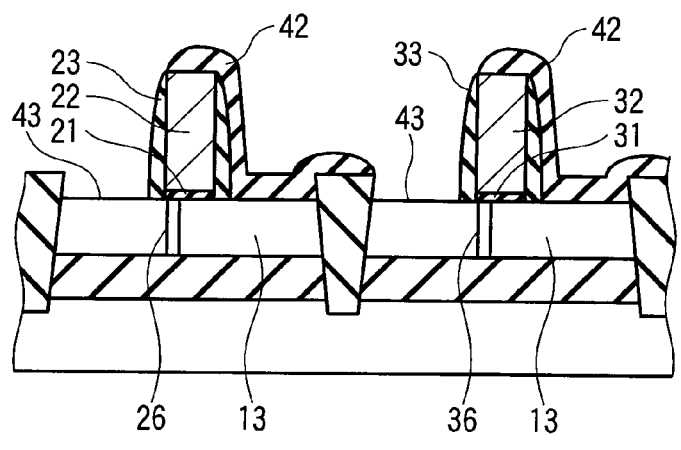

As shown in FIG. 5F, the Si thin films 26 and 36 having a thickness of 2 nm are selectively grown at the source edge by selectively epitaxial growth using an ultra-high-vacuum (UHV) CVD process, for example. Further, a Ge layer 43 is selectively grown to form a Ge/Si/Ge hetero structure. After the selectively epitaxial growth, an oxide film covering the side of the drain is removed using RIE. In this case, if the Si thin films 26 and 36 are thinner than 1 nm, these thin films do not function as a barrier. Conversely, if the Si thin films 26 and 36 are thicker than 3 nm, tunneling effect is not obtained. Therefore, preferably, each thickness of the Si thin films 26 and 36 is set to a range from 1 to 3 nm.

Figure 5G:
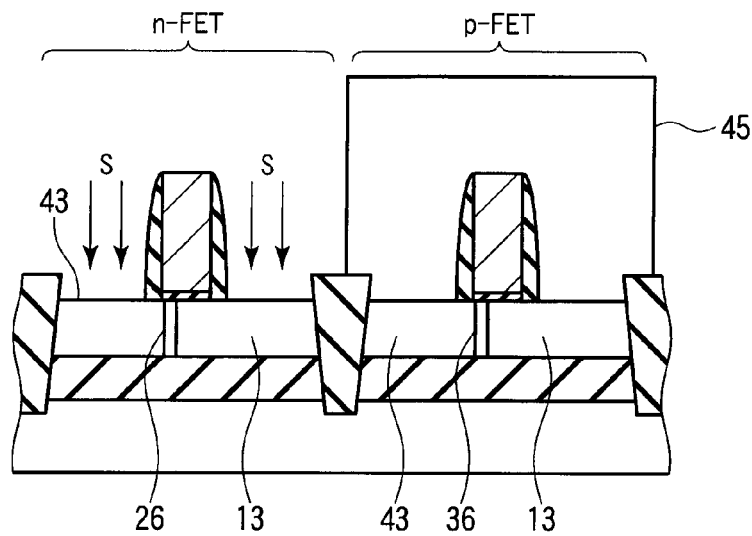

As illustrated in FIG. 5G, a resist mask 45 is formed on the p-type FET by using a photolithography process. Thereafter, S or Se ion is selectively implanted to the n-type FET with about $10^{15}$ $cm^2$. In this case, ion implantation of S or Se may be carried out after a source/drain germanide electrode is formed.

Figure 5H:
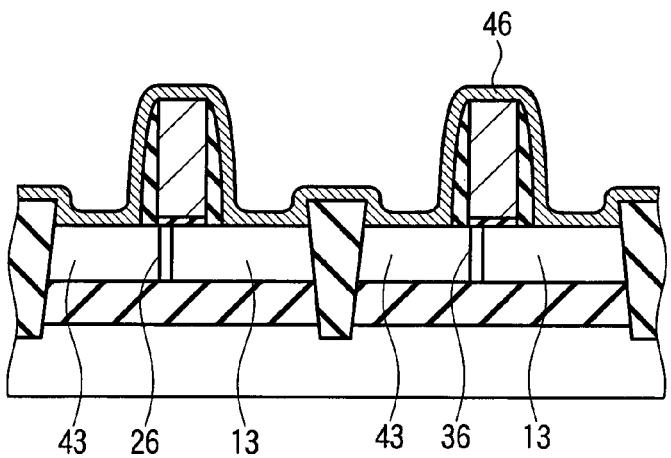
Figure 5I:
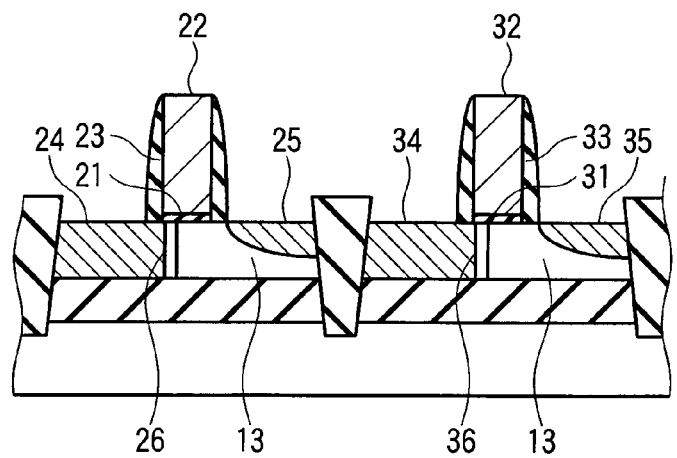

As depicted in FIG. 5H, the resist mask is removed, and thereafter a nickel film 46 is deposited on the entire surface to have a thickness of 10 nm by using sputtering.

Heat treatment is carried out at a temperature of 250° C. for one minute by using RTA, and thereafter a non-reaction nickel 46 is removed by means of a chemical solution process. Further, heat treatment is carried out at a temperature of 300° C. for one minute using by RTA. In this way, as seen from FIG. 5I, a metal compound (NiGe) is formed on a source/drain region. The NiGe functions as source/drain electrodes 24 and 25 of the n-type FET and source/drain electrodes 34 and 35 of the p-type FET. The growth of the NiGe formed by using this method stops at the Si interface in the source edge. Therefore, a steep NiGe/Si/Ge structure is realized.

In this case, germanide does not reach the bottom of the Ge layer 13 on the drain side. The reason why the shape of NiGe is different in source/drain is because the formation rate of germanization is fast in a source region formed by epitaxial growth.

The reason why the growth of NiGe stops at the Si interface will be explained below.

Inventors prepared a sample in which a Ge layer having a thickness of 30 nm which is formed on a silicon (Si) substrate having a plane orientation (100) or (110). Then, we experimentally confirmed a temperature range in which a germanium compound is selectively formed. FIGS. 7A to 7D show the microscope photographs when the foregoing prepared sample is processed at different heat treatment temperature.

Figures 7A, 7B, 7C, 7D:
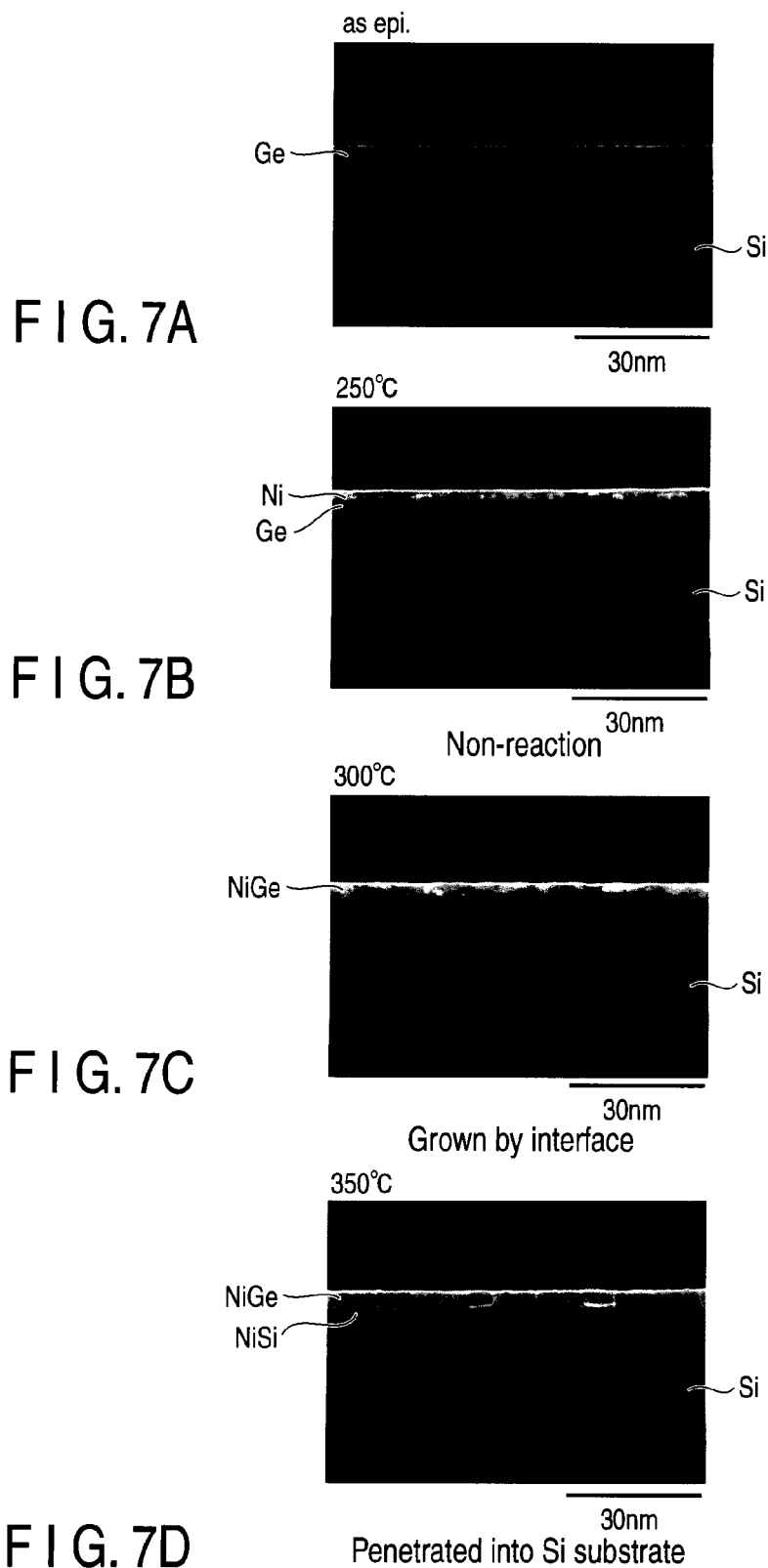
FIGS. 7A, 7B, 7C and 7D are microscope photographs showing a state when a germanium compound is formed with respect to a heat treatment temperature.

FIG. 7A shows the state that a Ge layer is formed on a Si substrate. A Ni layer is formed on the Ge layer, and thereafter heat treatment was carried out at a temperature of 250° C. with respect to the foregoing sample. As seen from FIG. 7B, Ge and Ni have almost no reaction. Contrast to the foregoing case, when heat treatment was carried out at a temperature of 300° C., as shown in FIG. 7C, all Ge is used for forming germanide, and further, Ge and Ni react with each other, and thus, a NiGe layer is formed. In this case, Ni and Si have almost no reaction. This is because the silicide temperature is higher than the germanization temperature. Moreover, when heat treatment was carried out at a temperature of 350° C., as seen from FIG. 7D, a NiGe layer is formed, and further, Ni and Si react with each other, and thus a NiSi layer is formed. This is because a temperature becomes high; as a result Si reacts with Ni.

Figure 8:
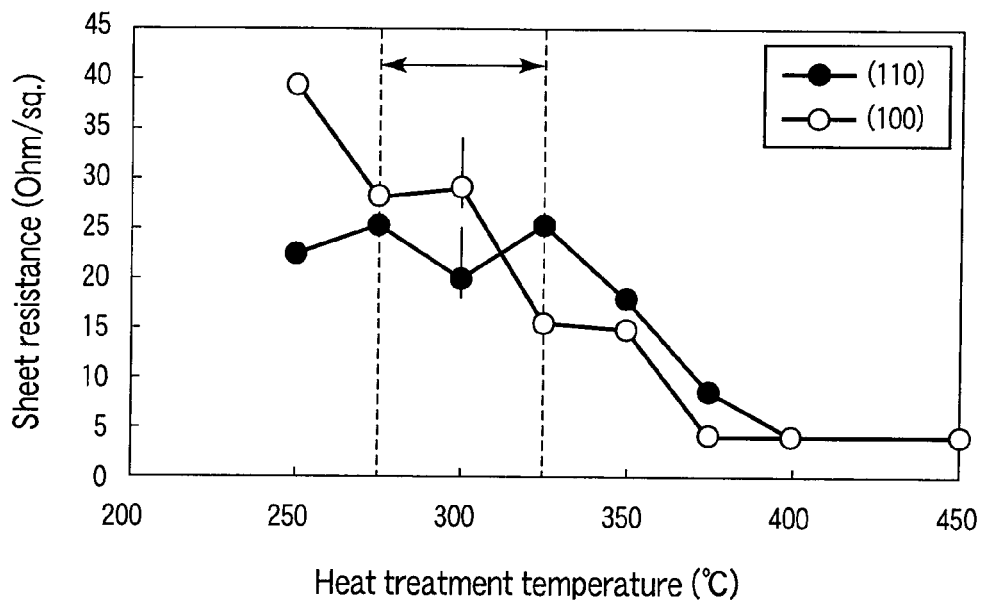
FIG. 8 is a graph to explain the relationship between a heat treatment temperature and a sheet resistance.

FIG. 8 is a graph to explain the relationship between an annealing temperature and a sheet resistance. In FIG. 8, a white circle shows the case where the plane orientation of Ge is (100), and a black circle shows the case where the plane orientation of Ge is (110). A sheet resistance is high less than 250° C. (in particular, sheet resistance of (100) is high). This means that Ni and Ge have almost no reaction. When the annealing temperature is more than 275° C., the sheet resistance is reduced. This means that Ni and Ge react with each other. Moreover, when the annealing temperature exceeds 325° C., the sheet resistance of (100) is remarkably reduced. This means that Ni and Si react with each other. Therefore, it is preferable that the annealing temperature is set to a temperature range from 275 to 325° C. in order to make Ge only reacted with Ni.

Figure 9A:
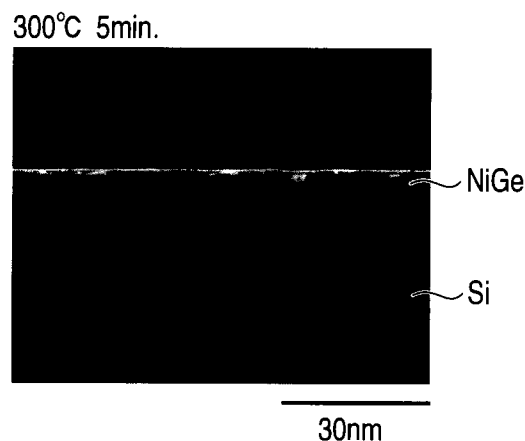
FIGS. 9A, 9B and 9C are microscope photographs showing a state when a germanium compound is formed with respect to a heat treatment time.
Figure 9B:
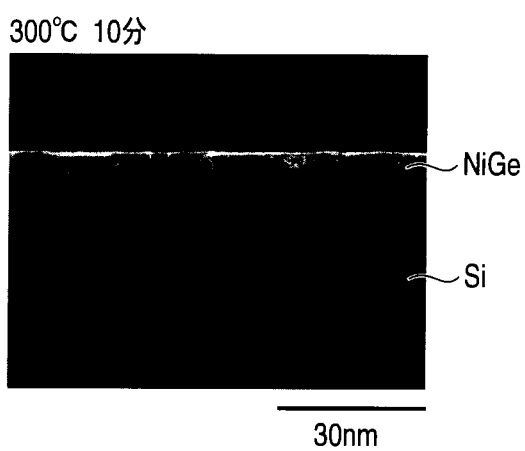
Figure 9C:
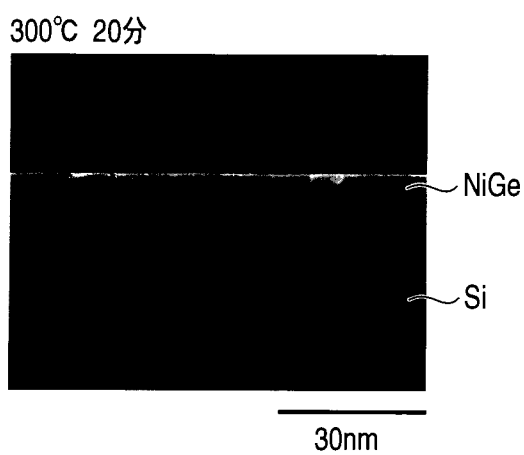

Moreover, inventors experimentally confirmed that a germanium compound is selectively formed without affected by heat treatment time when heat treatment is carried out at a temperature of 300° C. FIGS. 9A to 9C show microscope photographs when the same sample as above is used, and heat treatment is carried out at different time.

When heat treatment is carried out at a temperature of 300° C. for five minutes, as shown in FIG. 9A, a reaction of Ni with Ge advances, and it can be seen that NiGe is formed. When heat treatment is carried out at a temperature of 300° C. for ten minutes, as shown in FIG. 9B, a reaction of Ni with Ge further advances; therefore, the whole of Ge reacts with Ni, and it can be seen that NiGe is formed. When heat treatment is carried out at a temperature of 300° C. for 20 minutes, as shown in FIG. 9C, the amount of NiGe is unchanged, and it can be seen that a reaction of Ni with Ge is already saturated. In this case, a reaction of Ni with Si is not generated.

Figure 10:
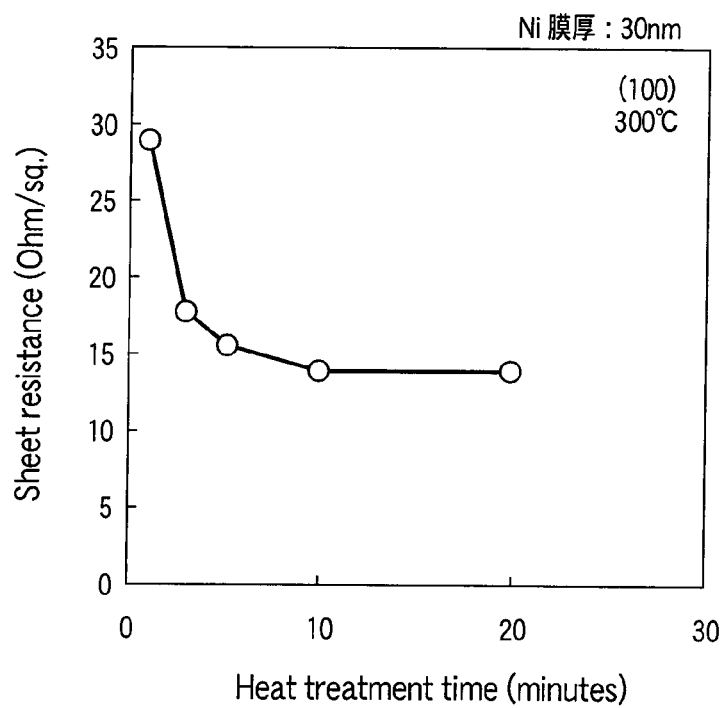
FIG. 10 is a graph to explain the relationship between a heat treatment time and a sheet resistance.

FIG. 10 is a graph to explain a change of a sheet resistance with respect to annealing time when a Ge layer having a plane orientation (100) is heated at a temperature of 300° C. When annealing starts, a sheet resistance gradually decreases, and then becomes approximately constant after about ten minutes. Even if annealing is carried out for time more than ten minutes, the sheet resistance is unchanged. This means that Ge only, which is formed thin on a Si substrate, reacts with Ni, and the under-layer of the Si substrate does not react with Ni.

Therefore, germanization is formed at a temperature range from 275 to 325° C. and thereby, the Ge layer 43 only is formed as germanization without affected by heat treatment time. In this way, it is possible to form NiGe source electrodes 24 and 34. This serves to keep the thickness of the Si thin films 26 and 36, which are controlled in their film thickness.

As described above, according to this embodiment, when a source region is etched to form a trench, the anisotropic etching process of preferentially leaving a Ge (110) plane is carried out in addition to etching such as RIE. In this way, it is possible to reduce LER of the junction interface, which is a factor of threshold voltage variations. In addition, the source electrodes 24 and 34 are formed using a selective germanidation process such that germanide growth stops at the interface in a Ge/Si hetero junction of a source edge. Therefore, it is possible to realize a uniform and a steep source junction. As a result, the improvement of yield is considerably expected. Moreover, S or Se ion is implanted in the n-type FET before a source/drain germanide electrode is formed. Therefore, it is possible to reduce implantation defect in germanide generated by after-implantation. This serves to restrict an increase of the sheet resistance of germanide.

MODIFICATION EXAMPLE

The present invention is not limited to the foregoing each embodiment. The foregoing embodiments relate to a complementary FET including both of an n-type FET and a p-type FET. The present invention is not necessarily limited to a complementary type; in this case, a semiconductor device may be configured by using the n-type FET only or and the p-type FET only.

Moreover, a first semiconductor layer functioning as a channel of a FET is not necessarily limited to a Ge layer formed on an insulating film. In this case, a Ge substrate may be used, and further a compound of Ge and Si, that is, $Si_{1-x}Ge_x$ ($0<x\leq1$) layer may be used. More specifically, if a tunnel barrier layer is formed of silicon (Si), a channel Ge density of 35% or more is required in order to set a band offset ΔEc of a conduction band to 0.2 eV or more. Namely, it is necessary to satisfy a relationship of $0.35\leq x\leq1$. The strain of the first semiconductor layer may be relaxed. The channel strain is effective to the n-type FET; therefore, strain may be given to the n-type FET only.

Moreover, a second semiconductor layer formed in a trench of a source/drain is not necessarily limited to Ge. Changes may be properly made in accordance with the specifications. The Ge density may be SiGe of 70% or more. In order to form a source/drain electrode, a metal combined with the second semiconductor layer is not necessarily limited to Ni; in this case, Pt and Pd may be used. In addition, an alloy of Ni, Pt and Pd may be used.

Figure 11A:
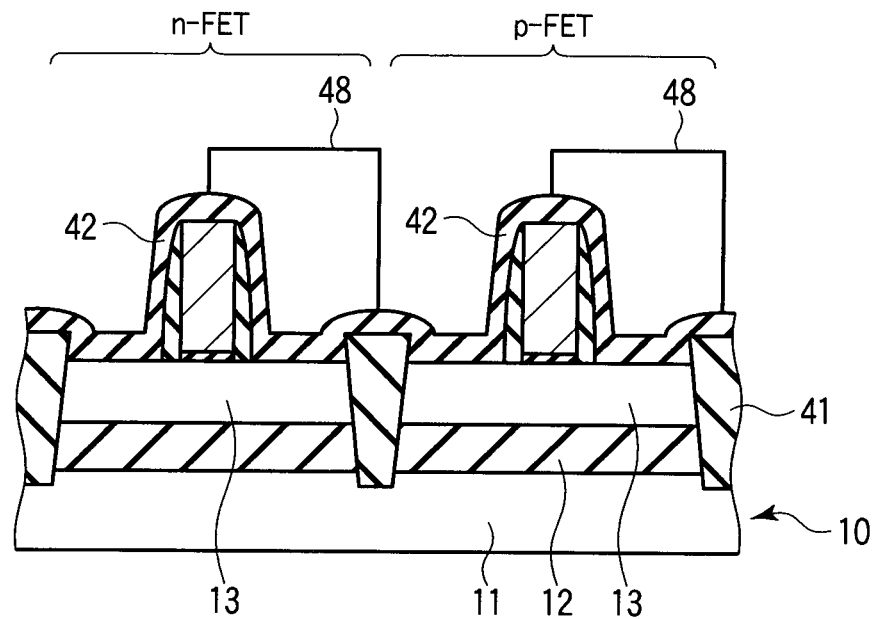
FIGS. 11A and 11B are cross-sectional views to explain a modification example.
Figure 11B:
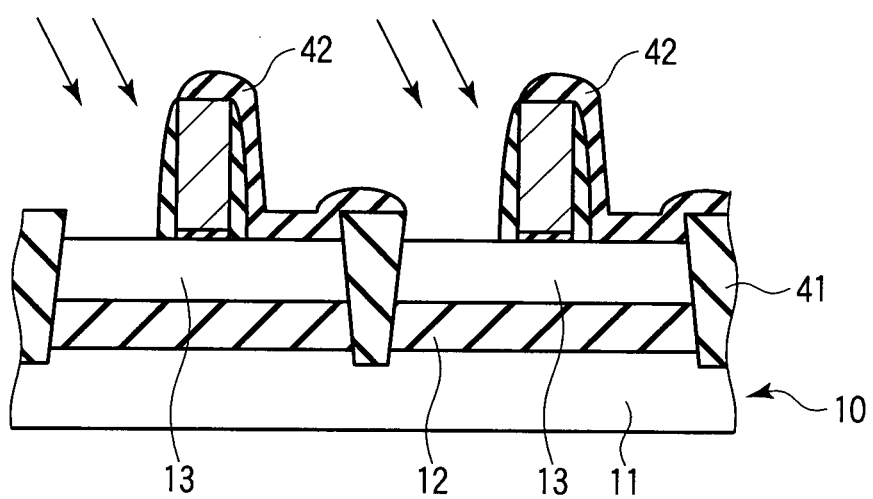

In the process flow described in the second embodiment, the process of selectively removing a mask of a source portion is not limited to the oblique implantation of carbon shown in FIG. 5B. For example, as illustrated in FIG. 11A, an opening of the source portion may be covered with a resist mask 48 by using a well-known photolithography process. Moreover, as seen from FIG. 11B, oblique RIE may be employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor layer, which is made of $Si_{1-x}Ge_x$ ($0<x\leq1$);
   a gate electrode, which is formed on the first semiconductor layer through a gate insulating film and has two sides opposite to each other;
   a source electrode, which is formed on one of the two sides of the gate electrode and on the first semiconductor layer, the source electrode being made of a compound of a metal and a second semiconductor including Ge;
   a drain electrode, which is formed on the other of the two sides of the gate electrode and on the first semiconductor layer, the drain electrode being made of a compound of the metal and a material of the first semiconductor layer; and
   a silicon (Si) thin film as a tunnel barrier, which is formed between the source electrode and the first semiconductor layer and in contact with the source electrode,
   wherein an edge portion on a gate side of the source electrode and an edge portion on a gate side of the drain electrode have a positional relationship of being asymmetrical to a gate side of the gate electrode, such that the edge portion on the gate side of the drain electrode is spaced farther away from an edge portion of the gate electrode in a gate length direction than the edge portion on the gate side of the source electrode.

2. The device according to claim 1, wherein an edge portion on a source side of the gate electrode coincides with an interface between the Si thin film and the source electrode.

3. The device according to claim 1, wherein an edge portion on a source side of the gate electrode overlaps the source electrode.

4. The device according to claim 1, wherein the first semiconductor layer, the gate electrode, the gate insulating film, the source electrode, the drain electrode and the Si thin film form an n-type field-effect transistor (FET).

5. The device according to claim 4, wherein the first semiconductor layer has a compression strain.

6. The device according to claim 4, wherein at least one of S and Se is segregated to an interface between the source electrode and the Si thin film and an interface between the drain electrode and the first semiconductor layer.

7. The device according to claim 1, wherein the first semiconductor layer, the Si thin film, the source electrode and the drain electrode are insulatively disposed over a substrate.

8. The device according to claim 1, wherein each metal of the source electrode and the drain electrode is made of a metal compound of Ge and Ni or Pt.

9. The device according to claim 1, wherein a width of the Si thin film in the gate length direction is between 1 and 3 nm inclusive.

10. The device according to claim 1, wherein an interface between the source electrode and the Si thin film forms a Schottky junction.

* * * * *